United States Patent
Tang et al.

(10) Patent No.: US 7,779,960 B2
(45) Date of Patent: Aug. 24, 2010

(54) SYSTEM AND METHOD FOR NOISE SUPPRESSION

(75) Inventors: Punan Tang, Houston, TX (US); Thomas P. Jasso, Houston, TX (US); Mohammed I. Chowdhury, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 526 days.

(21) Appl. No.: 11/506,644

(22) Filed: Aug. 18, 2006

(65) Prior Publication Data

US 2008/0065245 A1  Mar. 13, 2008

(51) Int. Cl.
*F01N 1/16* (2006.01)
*F01N 1/24* (2006.01)
(52) U.S. Cl. ......... 181/225; 181/224; 181/287
(58) Field of Classification Search ......... 181/224, 181/225, 286, 287, 290, 295; 415/119
See application file for complete search history.

(56) References Cited

U.S. PATENT DOCUMENTS

| | | | |
|---|---|---|---|
| 4,089,618 A | 5/1978 | Patel | |
| 4,204,586 A * | 5/1980 | Hani et al. | 181/229 |
| 4,750,860 A * | 6/1988 | Kelley | 415/119 |
| 4,786,231 A * | 11/1988 | Kelley | 415/119 |
| 4,807,718 A * | 2/1989 | Lotz | 181/202 |
| 5,326,317 A * | 7/1994 | Ishizu et al. | 454/354 |
| 5,332,872 A * | 7/1994 | Ewanek | 181/224 |
| 5,448,645 A | 9/1995 | Guerci | |
| 5,478,199 A | 12/1995 | Gliebe | |
| 5,518,451 A * | 5/1996 | Renz et al. | 454/187 |
| 5,620,370 A * | 4/1997 | Umai et al. | 454/354 |
| 5,710,533 A | 1/1998 | Pla et al. | |
| 5,749,702 A * | 5/1998 | Datta et al. | 415/119 |
| 5,869,792 A * | 2/1999 | Allen et al. | 181/224 |
| 6,067,227 A * | 5/2000 | Katsui et al. | 361/695 |
| 6,104,608 A * | 8/2000 | Casinelli et al. | 361/692 |
| 6,145,616 A * | 11/2000 | Ewanek | 181/224 |
| 6,201,872 B1 | 3/2001 | Hersh et al. | |
| 6,217,281 B1 * | 4/2001 | Jeng et al. | 415/119 |
| 6,278,958 B1 | 8/2001 | Lee et al. | |
| 6,379,111 B1 | 4/2002 | Katoh et al. | |
| 6,457,550 B1 * | 10/2002 | Barry et al. | 181/224 |
| 6,481,527 B1 * | 11/2002 | French et al. | 181/201 |
| 6,501,652 B2 * | 12/2002 | Katsui | 361/697 |
| 6,524,064 B2 * | 2/2003 | Chou et al. | 415/119 |
| 6,626,640 B2 | 9/2003 | Ivanovic | |
| 6,755,616 B1 | 6/2004 | Tzeng | |
| 6,880,813 B2 * | 4/2005 | Yazici et al. | 261/29 |
| 2006/0054380 A1 * | 3/2006 | Doll | 181/225 |
| 2006/0131101 A1 * | 6/2006 | Crocker | 181/224 |

(Continued)

OTHER PUBLICATIONS

Leo L. Beranek et al. *Noise and Vibration Control Engineering*, 1992, John Wiley & Sons, Inc., 7 pages.

(Continued)

*Primary Examiner*—Jeffrey Donels
*Assistant Examiner*—Jeremy Luks

(57) ABSTRACT

Embodiments of the present invention relate to a computer system. In one embodiment, the computer system comprises a fan and a muffler configured to suppress noise from the fan. The muffler may comprise a plurality of acoustic absorption sheets, wherein the acoustic absorption sheets each have a hole at least generally aligned with a flow area of the fan.

16 Claims, 5 Drawing Sheets

U.S. PATENT DOCUMENTS

2006/0144638 A1 * 7/2006 Radatus et al. .............. 181/224

OTHER PUBLICATIONS

Stephen Horowitz et al. *Characterization of Compliant-Backplate Helmholtz Resonators for an Electromechanical Acoustic Liner*, 40th Aerospace Science Meeting & Exhibit, Jan. 14-17, 2002, Reno, NV.

Xianfan Li et al. *Optimized Shapes of Oscillating Resonators for Generating High-Amplitude Pressure Waves*, J. Accoust. Soc. Am., vol. 16, No. 5, Nov. 2004.

Punan Tang, *A High Performance Acoustical Resonator for the Fan Tones Noise Suppression*, 2006, Abstract for Hewlett-Packard Company TechCon 2006, 5 pages.

Overclockers, Internet brochure and order information for Fan Mufflers, 5 pages, http://www.overclockers.com/articles716.

Muffled Computing, Internet brochure and order information for Muffled Computing, Muffled Computing, Inc., 1 page, http://www.muffledcomputing.com.

* cited by examiner

SYSTEM AND METHOD FOR NOISE SUPPRESSION

BACKGROUND

Computers, such as servers, personal computers (PCs), and notebook computers, have seen dramatic increases in processing speed and performance while becoming smaller in size than their predecessors. As a result of these changes in performance and size, efficient cooling systems are becoming increasingly desirable for such computer systems. Specifically, it is becoming more desirable for computer cooling systems to remove greater amounts of heat per volume of space in the computers. Existing cooling techniques often employ multiple fans and/or high rotational speeds to prevent heat build up in certain areas of computer systems. While measures such as these generally improve cooling efficiency, they also cause significant noise, particularly in rack systems having multiple fans.

DETAILED DESCRIPTION

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Embodiments of the present invention are directed to efficient systems and apparatuses for reducing or suppressing noise emissions related to forced air computer cooling systems. Specifically, embodiments of the present invention are directed to suppressing broadband noise and single tone or multi-tone noises that dominate noise emitted as a result of turbulent air flow, and noise related to fan blade vibration, and/or air moving devices (e.g., fans) utilized in forced air cooling systems. Further, present embodiments may include devices that are tunable. Specifically, for example, present embodiments may be configured such that they can be tuned (e.g., adjusted or constructed in various noise absorbing configurations or structured layouts) to reduce or suppress specific noises in certain wide frequency bands or tonal noise frequencies. It should be noted that embodiments may include or be implemented with various types of electronics, computers, and computer or server systems. For example, embodiments of the present invention may be utilized in blade server systems, distributed control systems, personal computers, notebook computers, and so forth to reduce the propagation of noise produced by their respective forced air cooling systems (e.g., one or more fans) and other noise producing components.

Figure 1:
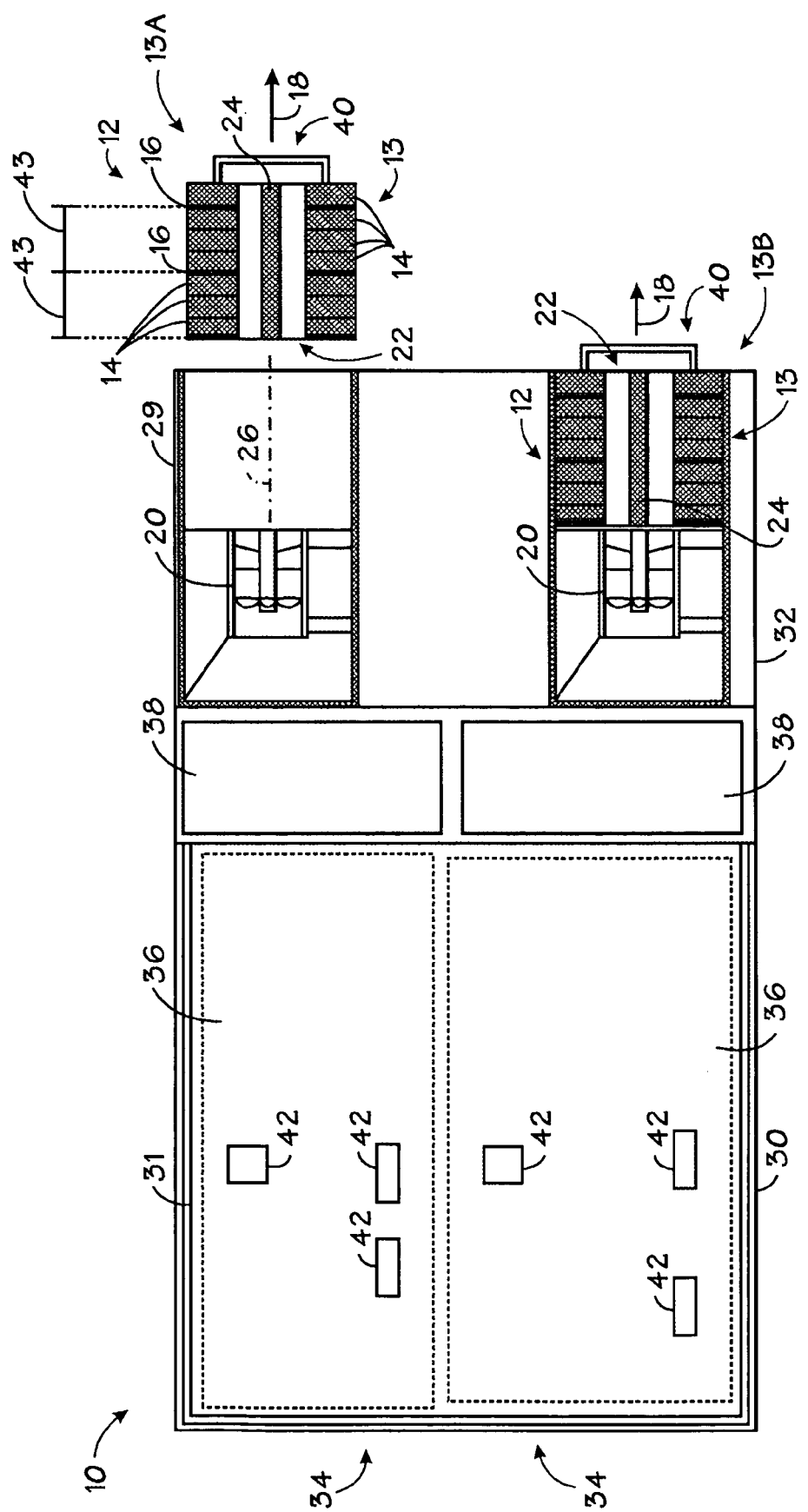
FIG. 1 is a cross-sectional side view of a server system utilizing one or more noise suppression components in accordance with an embodiment of the present invention.

FIG. 1 is a cross-sectional side view of a server system 10 utilizing one or more noise suppression components 12 in a muffler 13 in accordance with embodiments of the present invention. It may be desirable to cool certain electronic components in the server system 10 to increase reliability, reduce potential for damage, and improve performance. Accordingly, in the illustrated embodiment, one or more cooling fans 20 are configured to force air through the server system 10, which forces heat away from certain electronic components 42 (e.g., processors, memory, and hard drives) of the server system 10 via convection heat transfer. Specifically, in the illustrated embodiment, the fans 20 are arranged to pull air through and/or across servers 36 disposed in a chassis 30. This flow of air over the servers 36 facilitates heat transfer between the servers 36 and the flowing air. For example, the servers 36 and/or server components 42 may create heat during operation causing the temperature in the server system 10 to exceed the temperature of ambient or cooled air being forced through the system 10. Some of this heat may be transferred into the flowing air. Once the air has absorbed heat being emitted from the servers 36, the air is expelled from the server system 10 via the exhaust 40 of the cooling system 32, thus removing heat from the servers 36 and generally cooling the server system 10.

Figure 2:
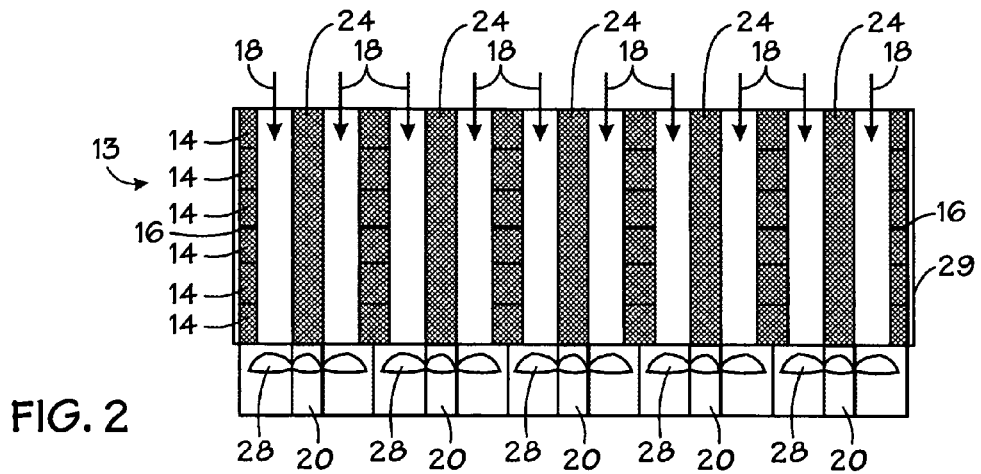
FIG. 2 is a cross-sectional top view of noise suppression components in accordance with an exemplary embodiment of the present invention.

It should be noted that in some embodiments, the fans 20 may be reoriented or reversed to push air rather than pull the air through and/or across the servers 36, as illustrated in FIG. 2. Further, it should be noted that the illustrated server system 10 is merely one example of an application in accordance with embodiments of the present invention. As mentioned above, other embodiments may be utilized in various electronic and computer applications in addition to server systems. For example, the block elements 36 (e.g., servers) may be exemplary of any number of heat producing computer components in a wide variety of computer systems wherein it is desirable to cool the components during operation. Specifically, for example, the elements 36 may be representative of a processor, a power supply, a memory, a video device, or an audio device in a standard personal computing system or notebook computer. For example, the memory may include a hard drive, read only memory (ROM), or random access memory (RAM), and the audio and video devices may include audio and video circuits or expansion cards. In other electronics, the elements 36 may be capacitors, transformers, resistors, amplifiers, and so forth.

The noise suppression components 12 of the muffler 13 include acoustic absorption sheets 14 and tuning baffles or dividers 16 arranged along flow paths 18 of the fans 20 of the server system 10. In the illustrated embodiment, the acoustic absorption sheets 14 are elongate pieces of acoustical material (e.g., foam, porous plastic) with holes 22 disposed therein. The acoustical material may be selected (i.e., tuned) by a user or manufacturer based on fan noise characteristics. For example, Melamine foam is a type of foam that may be selected for the acoustical material when fan noise is in the range of 800-2,000 Hz. Other types of acoustical material may be selected depending on sound absorbing characteristics and other properties (e.g., reaction to temperature, reaction to humidity, and reliability). It should be noted that the muffler 13 designated by reference numeral 13A is removed from the server system 10 and the muffler 13 designated by reference numeral 13B is secured within the server system. This indicates that the muffler 13 may be removable in accordance with present embodiments. Indeed, in some embodiments, the muffler 13 may be provided separately. Separation of the muffler 13 from the noise producing component (e.g., system 10) facilitates modification or tuning of the muffler to adjust for characteristics of noise (e.g., volume, frequency) being produced. For example, the muffler 13 may be removed from the system 10 to add additional noise suppression components 12 to address a change in noise volume.

The holes 22 in the absorption sheets 14 are arranged to coincide with the flow paths 18 and to facilitate air flow from the fans 20 through the holes 22. Additionally, the holes 22 are sized to correspond to the size of the fans 20 to reduce or eliminate the potential for resistance to air flow. It should be noted that the acoustical material utilized in accordance with present embodiments may include high performance acoustic absorption foams that provide advantages in acoustic absorptions from 500 Hz to 10 kHz, and resistance to wear from harsh environments. The dividers 16 may include elongate pieces of material (e.g., metal) that are shaped to correspond to and align with the absorption sheets 14. As discussed in detail below, the noise suppression components 12 may be positioned adjacent to the fans 20 and in the flow paths 18 of the fans 20 such that the noise suppression components 12 substantially reduce noise related the operation of the fans 20. Further, the noise suppression components 12 may be adjusted or tuned to facilitate suppression of particular types of noise characterized in range of the frequency and amplitude. For example, the dividers 16 are made of metal in some embodiments to increase acoustic reflections inside the muffler 13.

Figure 3:
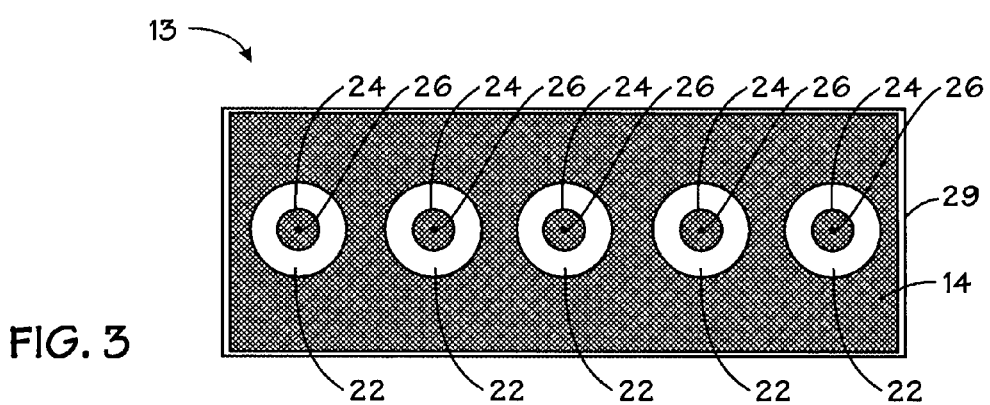
FIG. 3 is a cross-sectional front view of noise suppression components in accordance with an exemplary embodiment of the present invention.
Figure 4:
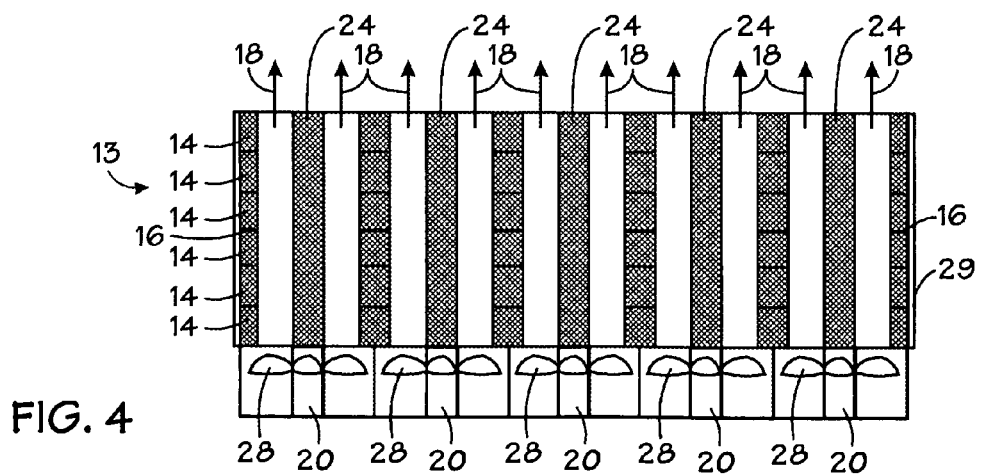
FIG. 4 is a cross-sectional top view of noise suppression components in accordance with an exemplary embodiment of the present invention.

In accordance with some embodiments, to further suppress noise, cones or shafts 24 (e.g., elongate foam cores or a shaft shaped resonators) are disposed in one or more of the holes 22 to function as additional noise suppression components 12. Specifically, the shafts 24 are disposed substantially along respective centerlines 26 of the holes 22, as is clearly illustrated in the cross-sectional front view of the muffler 13 in FIG. 3. Further, the shafts 24 couple directly to portions of the fans 20 for support. This coupling is clearly illustrated in FIG. 4, which is a cross-sectional top view of the muffler 13 illustrated in FIG. 3. Specifically, as illustrated in FIG. 4, the shafts 24 couple to the fans 20 such that direct air flow is not blocked by the shafts 24. Indeed, the shafts 24 each respectively align with and couple to the fans 20 proximate a central axis 28 of each of the fans 20. The portions of the fans 20 near the central axes 28 generally do not produce significant flow, thus, the shafts 24 generally do not block air flow from the fans 20. It should be noted that in some embodiments these shafts 24 are made of acoustical material, such as the acoustical material used to form the acoustic absorption sheets 14. Thus, the shafts 24 may cooperate with the acoustic absorption sheets 14 and dividers 16 to absorb and suppress noise originating from operation of the fans 20. In other embodiments, the shafts 24 are made of a material (e.g., plastic with a smooth outer texture) that reduces turbulent flow, thus reducing noise associated with the turbulence. Further, in some embodiments, proper arrangement of the shafts 24 reduces turbulent air flow produced by the fans 20, thus, further reducing noise.

The noise suppression components 12 (e.g., the acoustic absorption sheets 14, the dividers 16, and the shafts 24) may be arranged and disposed within a silencer case 29 that is configured to be disposed within the server system 10 adjacent the fans 20. The silencer case 29 may essentially define the outer surface of the muffler 13. The silencer case 29 may be constructed of sheet metal or another substantially rigid material. In some embodiments, the silencer case 29 may be lined with or constructed of acoustical material (e.g., foam). Additionally, the silencer case 29 may include openings that correspond to the flow paths 18. Further, like the holes 22, the openings may be sized to correspond to the fan sizes such that air flow is not hindered or blocked. It should be noted that the silencer case 29 and each of the noise suppression components 12 may cooperate to facilitate noise absorption. For example, the dividers 16, the shafts 24, and/or the silencer case 29 may provide multi-bounce surfaces or reflection surfaces that reflect/block sound waves, thus, causing the sound to bounce around inside the silencer case 29. This bouncing of the sound waves may increase the efficiency of the acoustic absorption material, thus, increasing noise dissipation. In other words, the bouncing waves become redirected back toward the acoustic absorption material, which further absorbs the noise. Thus, the sound waves are substantially retained within the silencer case 12, such that the acoustic absorption material can progressively reduce the noise.

The server system 10 includes a chassis 30 attached to a forced air cooling system 32. The chassis 30 includes two substantially identical bays 34, each of which is arranged to hold at least one computer module or server 36 (e.g., a blade server). It should be noted that in some embodiments the server system 10 includes a single bay 34 or multiple bays 34. Further, in some embodiments the bays 34 may be shaped and sized differently. The forced air cooling system 32 includes one or more air passages 38, one or more fans 20, and one or more noise suppression components 12. The one or more air passages 38 essentially link the servers 36 with the forced air cooling system 32 and facilitate air flow over the servers 36 and into the fans 20, which are the drive mechanism of the cooling system 32. The air exits the cooling system 32 at one or more exhausts 40. The cooling system 32 is arranged to cool various components (e.g., servers 36) in the chassis 30 of the server system 10. It should be noted that the illustrated embodiment is merely exemplary, and other embodiments may include configurations for cooling devices (e.g., desktop computers and laptop computers) other than server systems.

As previously discussed, the cooling system 32 utilizes the fans 20 to induce forced air convection and, thus, to remove heat from the servers 36 and the various computer components 42 (e.g., one or more processors, memories, hard drives, video cards, power supplies, computers, video devices, audio devices, or a combination thereof). Further, as discussed above, this cooling process produces noise. For example, noise may be produced as a result of fan blade rotation, blade resonant vibration, movement of mechanical components driving the blades, turbulent air flow, and so forth. Further, the noise produced may change over time. Specifically, noise levels and/or tones may change because of variations in conditions (e.g., ambient temperature and fan degradation) relating to operation of the cooling system 32. For example, as discussed in further detail below, noise levels may increase because fan speeds are increased to deal with inefficiencies in cooling that result from changes in environmental conditions, such as an increase in the temperature of air being passed through the cooling system 32. Further, noise levels and/or tone may change because of the degradation of fan components and/or changes in the performance of the fans 20.

As suggested above, it may be desirable to increase the forced air convection to increase the amount of heat being removed from the system 10. Increased heat removal using the fan driven forced air cooling system 32 may be achieved by increasing the flow rate through the cooling system 32. Such an increase in flow rate may be achieved by increasing the size of the fans 20 (e.g., larger fan blades) or by increasing the rotational speed of the fans 20. Because space may be limited, the preferred option may be to increase the speed of the fans 20. However, increasing fan 20 speed typically results in a corresponding increase in noise levels generated by the fans 20 and/or a different noise tone generation. In other words, the increased speed of the moving components (e.g., motor components) of the fans 20 and/or turbulent air generated by the fans 20 at the higher speeds may produce tonal noise in the working environment around the system 10 that is different than previously produced. Further, as suggested above, degradation of the fans 20 may produce different noises. For example, a particular fan 20 may get slightly out of balance and make different tonal noises during rotation.

Embodiments of the present technique address changes in noise levels and/or tones, such as those discussed above, by adjustably suppressing the noise. In other words, present embodiments can be adjusted or tuned by a user or manufacturer to correspond to specific noise levels and/or tones. This tuning may take place prior to shipment of the muffler 13 and/or on location by a consumer/operator. Positioning and repositioning of the noise suppression components 12 with respect to one another to suppress particular noises or noise components may be referred to as tuning. For example, in one embodiment, the cooling system 36 includes noise suppression components 12 (e.g., the acoustic absorption sheets 14, the dividers 16, and/or the shafts 24) that can be rearranged and/or added based on the type or level of noise being produced. Specifically, in one embodiment, additional acoustic absorption sheets 14 may be stacked adjacent to one another to address increased noise volume. Further, one or more dividers 16 may be placed within a stack of the acoustic absorption sheets 14 in particular positions to suppress a particular tonal noise. Indeed, the position of a single divider 16 (e.g., with respect to other noise suppression components) or a distance between multiple dividers 16 may be adjusted or tuned to substantially maximize attenuation efficiency per noise wavelength, which may vary with fan type and speed.

Tuning or adjustment of the muffler 13 and the noise suppression components 12 may be guided by calculations based on a measured value for the noise (e.g., measured wavelength). Additionally, a trial and error approach may be employed to tune and adjust the muffler 13 and the noise suppression components 12. In one embodiment, a plurality of the dividers 16 may be spaced apart based on one quarter of the wavelength of a noise that is to be reduced. For example, a user may measure the amplitude of the noise and adjust the muffler accordingly. Specifically, for example, if the fans 20 produce maximum noise amplitude of 1,000 Hz with an acoustical wavelength of twelve inches, a distance 43 between dividers is set at three inches, as illustrated in FIG. 1. This improves the maximum attenuation of the muffler 13 in addition to the absorption of the acoustical material.

Figure 5:
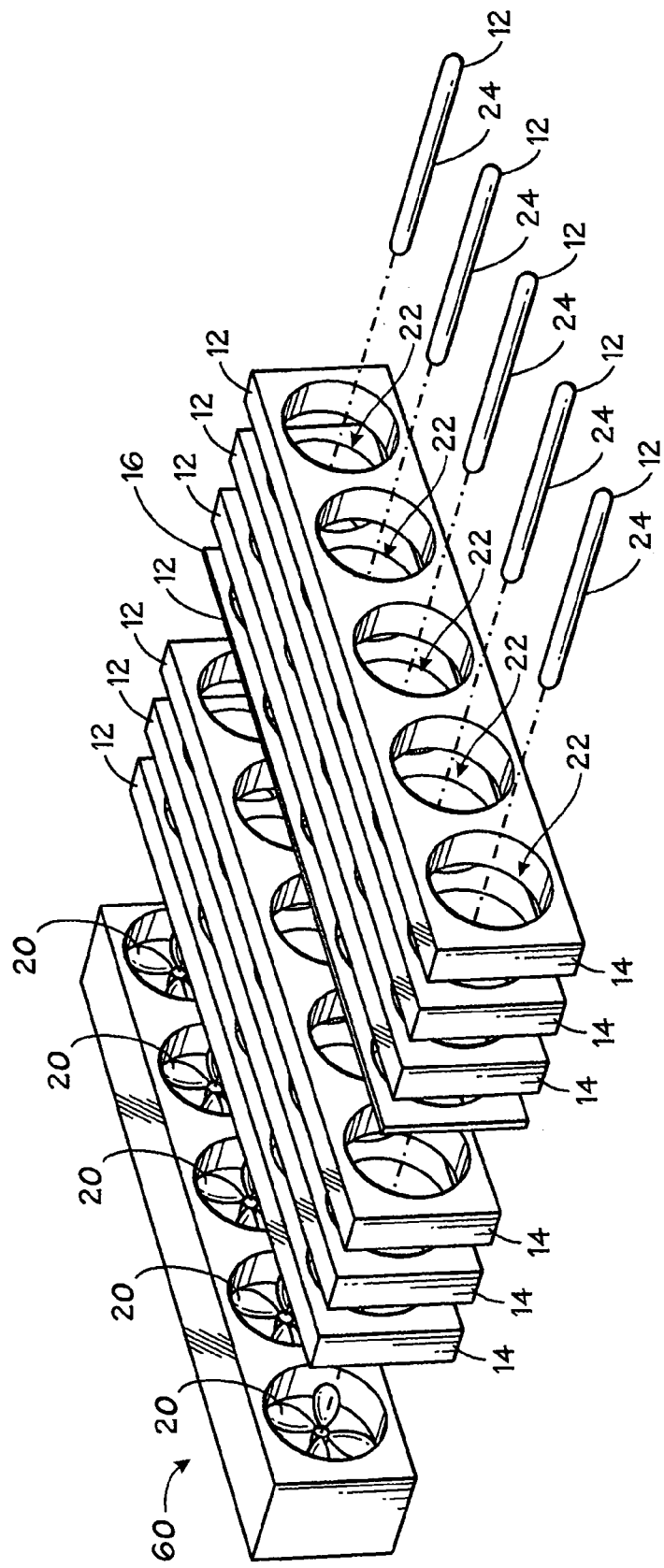
FIG. 5 is an exploded perspective view of a fan bank and an arrangement of various noise suppression components in accordance with an exemplary embodiment of the present invention.

FIG. 5 is an exploded perspective view of a fan bank 60 and an arrangement of various noise suppression components 12 in accordance with present embodiments. The noise suppression components 12 include a single divider 16 disposed between two sets of three acoustic absorption sheets 14. The noise suppression components 12 may be arranged within the silencer case 29 in a particular order, and inserted into the server system 10 adjacent the fan bank 60. It should be noted that the divider 16 or multiple dividers 16 may be arranged or positioned among the other noise suppression components 12 to correspond with a particular noise wavelength. It should be noted that in other embodiments, tuning may include installing or rearranging additional dividers 16, acoustic absorption sheets 14, shafts 24, and so forth to address volume and tonal changes. Indeed, in one embodiment, different types of absorption material (e.g., varying foam compositions) may be used in various combinations to increase noise absorption efficiency. For example, particular types of foam may be used to form the acoustic absorption sheets 14 and to coat the silencer case 29. In other words, the material properties of the noise suppression components 12 may be tuned to accommodate particular noise types and levels.

In the illustrated embodiment, the holes 22 in each of the acoustic absorption sheets 14 and the divider 16 combine to form a passage with a generally circular perimeter that permits air flow. Specifically, in the illustrated embodiment, the holes 22 are sized and shaped to correspond to the cross-sectional flow area of the fans 20. In other words, each of the holes 22 is sized and shaped to correspond to the cross-section of air flow produced by an adjacent fan 20. Matching the holes 22 with the flow area of the corresponding fan 20 facilitates alignment of the fan 20 with the noise suppression components 12, such that undesirable flow characteristics and associated noises are reduced or prevented. For example, such an alignment may reduce flow losses that occur when air from the fan 20 strikes an unaligned surface. Further, the alignment of the holes 22 with the flow area of the fans 20 makes the transition section between the fans 20 and noise suppression components smooth, which reduces turbulence and the noise associated with such turbulence. These benefits may result whether the noise suppression components 12 are located at the inlet of the fan 20, or at the outlet of the fan 20, or on opposite sides (e.g., inlet and outlet of the fan 20).

In the illustrated embodiment, the acoustic absorption sheets 14 and the divider 16 have a generally rectangular geometric outline. The acoustic absorption sheets 14 and the divider 16 are shaped based on the geometry of the fan bank 60, which has a rectangular perimeter. In other embodiments, the acoustic absorption sheets 14 and the divider 16 may have a different geometric outline depending on the shape and size of a different corresponding cooling fans 20. For example, the absorption sheets 14 and the divider 16 may have an octagonal geometric outline to correspond with a cooling fan having an octagonal casing. Matching the geometric outline of the noise suppression components 12 (e.g., the acoustic absorption sheets 14 and dividers 16) and the geometric outline of the fans 20 or fan bank 60 facilitates alignment, thus conserving space within the cooling system 32. It should be noted that in some embodiments, different shapes may be utilized for different components. For example, dividers 16 and various types of acoustic absorption sheets 14 may each have different perimeter shapes.

Figure 6:
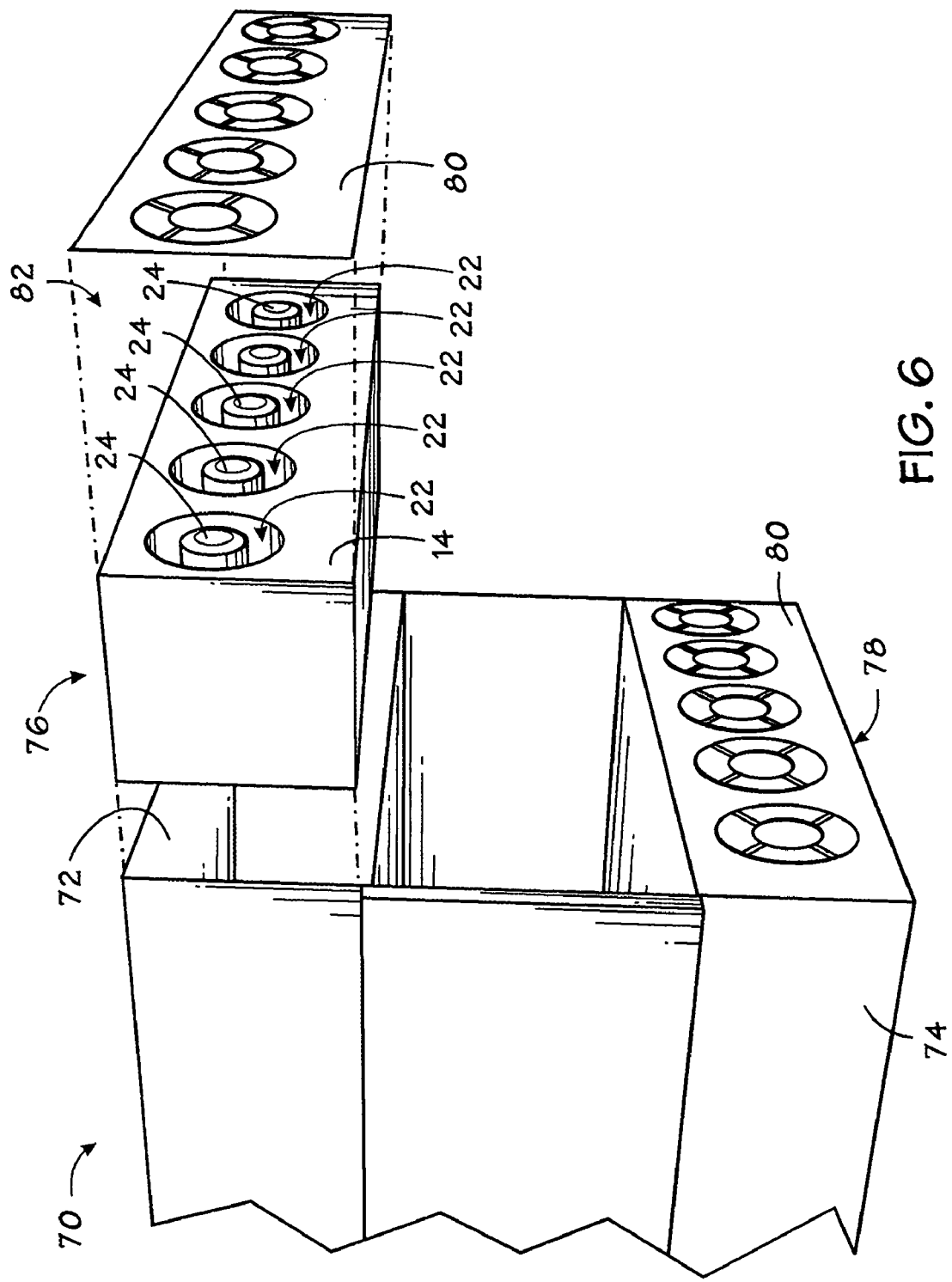
FIG. 6 is an exploded perspective view of a server cooling system in accordance with an exemplary embodiment of the present invention.

FIG. 6 is an exploded perspective view of a server cooling system 70 in accordance with an exemplary embodiment of the present invention. In the illustrated embodiment, the server cooling system 70 includes an upper bay 72 and a lower bay 74. Each of the bays includes five fans that drive air through the cooling system 70. The upper bay 72 is configured to receive a first silencer case 76, and the lower bay 74 is configured to receive a second silencer case 78. When installed, the silencer cases 76 and 78 are aligned with the fans to facilitate air flow and to suppress noise. Each of the silencer cases 76 and 78 may include an arrangement of noise suppression components 12 disposed therein. For example, as illustrated, the first silencer case 76 includes a plurality of acoustic absorption sheets 14 and a plurality of shafts 26 disposed within the holes 22 of the acoustic absorption sheets 14. A user may position these noise suppression components 12 within one of the silencer cases 76 or 78 in a configuration that will suppress a particular type of noise, as discussed above. Once the noise suppression components are properly disposed within the case 76 or 78, it may be slid into its respective bay 72 or 74 and secured adjacent the fans. Further, a lid 80 may be installed over an open end 82 of the silencer case 76 or 78 to prevent any of the noise suppression components from being expelled or jarred out of position. It should be noted that the lid may include openings that that align with the holes 22 to avoid substantially hindering direct airflow through the cooling system 70. In addition, the lid 80 may support or hold the peripheral ends of the shafts 24 in generally central positions within the holes 22.

Figure 7:
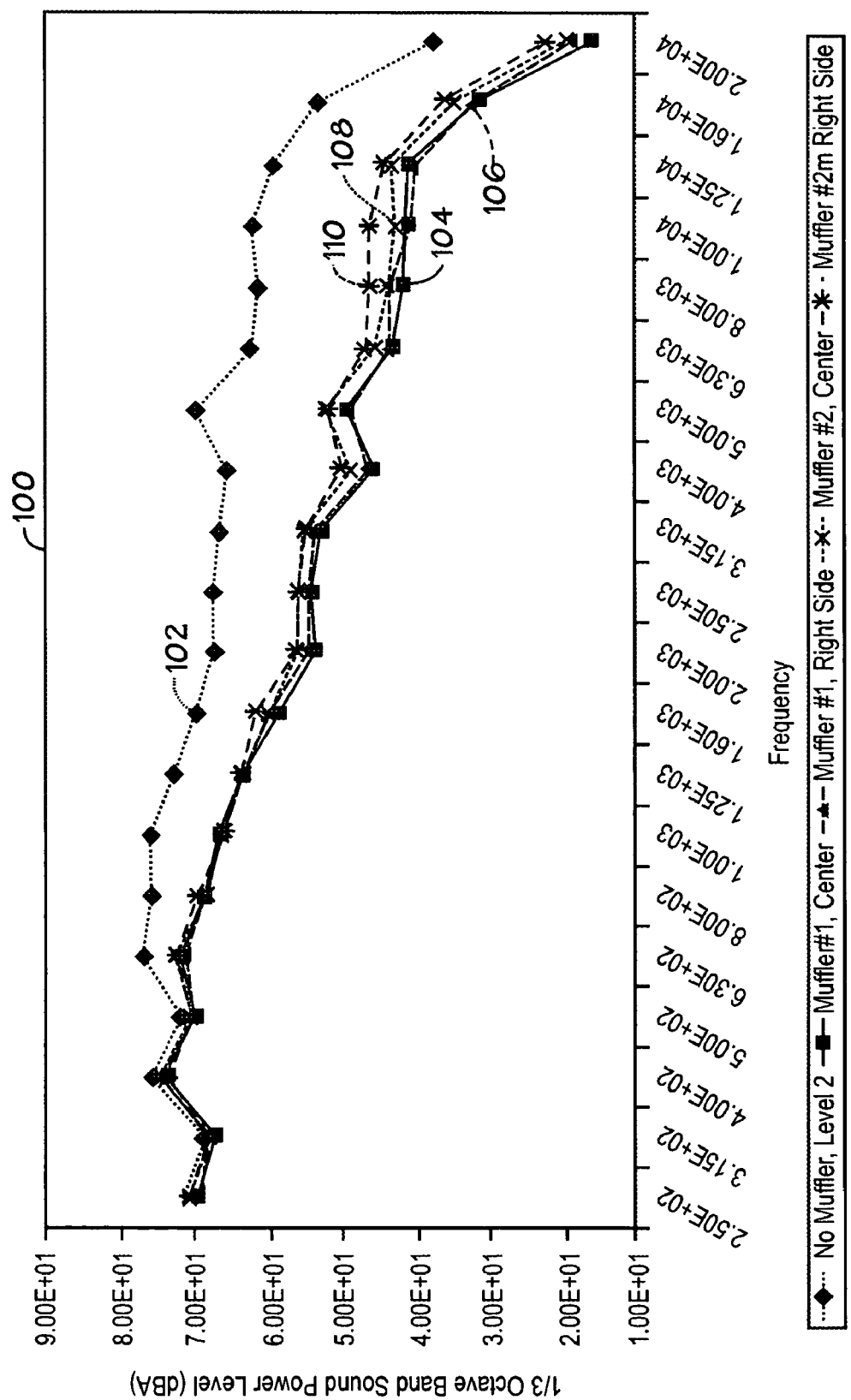
FIG. 7 is a line graph of one-third octave band sound power levels (decibels) produced by an exemplary cooling system plotted against corresponding noise frequencies for varying exhaust arrangements and noise suppression component configurations in accordance with exemplary embodiments of the present invention.

FIG. 7 is a line graph 100 of one-third octave band sound power levels (decibels) produced by an exemplary cooling system plotted against corresponding noise frequencies for varying exhaust arrangements and noise suppression component configurations in accordance with exemplary embodiments of the present invention. Graph 100 illustrates empirical data that demonstrates noise reduction based on the utilization of the adjustable noise suppression components 12 in accordance with present embodiments.

Specifically, graph 100 includes five plots (102, 104, 106, 108, and 110). Each of the first through the fifth plots (102, 104, 106, 108, and 110) represents a sound power level produced by the cooling system over a range of frequencies. The data for the first plot 102 was obtained without any noise suppression components 12 attached. The data for the second, third, fourth, and fifth plots 104, 106, 108, and 110 were obtained with one of two mufflers in place adjacent the drive mechanism (i.e., fan) of the cooling system. Each of the mufflers was formed from different noise suppression components. However, both mufflers included five holes each, wherein the holes were generally formed by alignment of respective holes in the noise suppression components forming the mufflers.

The data for the second and third plots 104 and 106 was obtained with a first muffler that was configured using Soundfoam M absorption materials. Soundfoam M absorption material is an acoustic quality, open cell, flexible polyether based polyurethane foam designed to provide longer life in humid environments, and is manufactured by Soundcoat Co. This first muffler included a single baffle divider inside. The second plot 104 was acquired while air flowed from the fan through the center hole of the five holes in the first muffler. The third plot 106 was acquired while air flowed through an end hole of the five holes in the first muffler.

In contrast, the data for the fourth and fifth plots 108 and 110 was obtained with a second muffler that was configured using Melamine foam. Melamine foam is an extremely lightweight, open-cell material which is resistant to heat. Melamine foam is frequently used for acoustical and thermal insulation, and is manufactured by American Micro Industries, Inc. The second muffler included a shaft or cone, and no divider. The fourth data plot 108 was acquired while air flowed from the fan through the center hole of the five holes in the second muffler. The fifth data plot 110 was acquired while air flowed from the fan through an end hold of the five holes in the second muffler.

The data illustrated in graph 100 demonstrates the efficiency of embodiments of the present invention. Specifically, as illustrated by graph 100, the fan noise was reduced dramatically in a very wide middle-high frequency range (400 to 20 Khz), and a robust performance was made in different hole locations. Graph 100 also demonstrates that a better sound attenuation performance can be obtained by a better tuning of the muffler configuration and absorption material in accordance with present embodiments.

The invention claimed is:

1. A computer system, comprising:
   a fan; and
   a muffler configured to suppress noise from the fan, wherein the muffler comprises:
      a plurality of acoustic absorption sheets comprising acoustic absorption material, wherein the acoustic absorption sheets each have a hole at least generally aligned with a flow area of the fan;
      a first divider positioned between the plurality of acoustic absorption sheets; and
      a shaft of acoustic absorption material at least generally aligned with a rotational axis of the fan and extending through the hole.

2. The system of claim 1, comprising a second divider positioned a specified distance from the first divider, wherein the specified distance is based on a wavelength of noise produced by the fan.

3. The system of claim 1, wherein the acoustic absorption sheets each have a plurality of holes at least generally aligned with a plurality of fans.

4. The system of claim 1, comprising a plurality of dividers positioned between the plurality of acoustic absorption sheets.

5. The system of claim 1, comprising a chassis coupled to the fan and the muffler.

6. The system of claim 5, wherein the chassis comprises a plurality computer components.

7. A system, comprising:
   an adjustable noise suppression apparatus configured to couple with a convection cooling system, comprising:
      a silencer case;
      a plurality of acoustic absorption members adjustably arrayed within the silencer case, wherein the plurality of acoustic absorption members each include at least one hole that generally aligns with a flow path of the convection cooling system;
      a divider adjustably arrayed between the acoustic absorption members within the silencer case in a particular position based on a noise wavelength to deflect noise within the silencer case, wherein the divider includes a passage there through that generally aligns with the flow path of the convection cooling system; and
      a shaft disposed within the at least one hole of each of the plurality of acoustic absorption members and the passage of the divider.

8. The system of claim 7, comprising a fan having the flow path across or through an electronic device.

9. The system of claim 8, wherein the electronic device comprises a blade server, a computer, a processor, memory, a power supply, a video device, an audio device, or a combination thereof.

10. The system of claim 7, wherein the silencer case comprises an acoustic foam lining.

11. The system of claim 7, wherein the plurality of acoustic absorption members includes individual acoustic absorption panels made of varying acoustic absorption materials.

12. The system of claim 7, comprising a plurality of dividers adjustably arranged between the acoustic absorption members and spaced with respect to one another based on one or more noise wavelengths.

13. A method of suppressing noise in a computer system, comprising:

inducting air through an electronic chassis via a fan;

passing the inducted air through a hole in each of a plurality of acoustic absorption panels to suppress noise from the fan, wherein the hole in each of the plurality of acoustic absorption panels generally aligns with a flow path of the fan;

passing the inducted air through a hole in at least one divider, wherein the hole in the at least one divider generally aligns with the hole in each of the plurality of acoustic absorption panels; and passing the inducted air around a shaft located within the hole in each of the plurality of acoustic absorption panels and the hole in the at least one divider.

14. The method of claim 13, comprising attenuating a selected range of noise frequency in the inducted air by passing the inducted air through a hole in a first divider and a second divider, wherein the first divider is located a selected distance from the second divider, the selected distance corresponding to the selected range of noise frequency.

15. The method of claim 14, wherein the selected distance is one quarter of a wavelength of the selected range of noise frequency.

16. The method of claim 13, comprising passing the inducted air through at least two acoustic absorption panels of different acoustic absorption material.

* * * * *

UNITED STATES PATENT AND TRADEMARK OFFICE
CERTIFICATE OF CORRECTION

| | | |
|---|---|---|
| PATENT NO. | : 7,779,960 B2 | Page 1 of 1 |
| APPLICATION NO. | : 11/506644 | |
| DATED | : August 24, 2010 | |
| INVENTOR(S) | : Punan Tang et al. | |

It is certified that error appears in the above-identified patent and that said Letters Patent is hereby corrected as shown below:

In column 8, line 40, in Claim 6, after "plurality" insert -- of --.

Signed and Sealed this
Eighth Day of March, 2011

David J. Kappos
*Director of the United States Patent and Trademark Office*